(12) United States Patent
Devries et al.

(10) Patent No.: US 6,836,158 B2
(45) Date of Patent: Dec. 28, 2004

(54) SIGNAL SAMPLING METHOD AND CIRCUIT FOR IMPROVED HOLD MODE ISOLATION

(75) Inventors: Christopher Andrew Devries, Ottawa (CA); Ralph Dickson Mason, Ottawa (CA)

(73) Assignee: ENQ Semiconductor Inc., Ottawa (CA)

( * ) Notice: Subject to any disclaimer, the term of this patent is extended or adjusted under 35 U.S.C. 154(b) by 0 days.

(21) Appl. No.: 10/639,544

(22) Filed: Aug. 12, 2003

(65) Prior Publication Data

US 2004/0032286 A1 Feb. 19, 2004

(30) Foreign Application Priority Data

Aug. 12, 2002 (CA) ............................................. 2395895

(51) Int. Cl.[7] .............................................. G11C 27/02
(52) U.S. Cl. ........................................................ 327/94
(58) Field of Search ................................ 327/91, 93–96, 327/554; 330/9; 341/122

(56) References Cited

U.S. PATENT DOCUMENTS

| 4,962,325 A | 10/1990 | Miller et al. |
| 5,315,170 A | 5/1994 | Vinn et al. |
| 5,389,929 A | 2/1995 | Nayebi et al. |
| 5,517,141 A | 5/1996 | Abdi et al. |
| 5,638,020 A * | 6/1997 | Koifman et al. ............. 327/382 |
| 5,914,638 A | 6/1999 | He |
| 6,028,459 A | 2/2000 | Birdsall et al. |
| 6,262,277 B1 | 7/2001 | Lee et al. |
| 6,275,076 B1 | 8/2001 | Simony |
| 6,384,758 B1 | 5/2002 | Michalski et al. |
| 6,700,417 B2 * | 3/2004 | Kawahito et al. ............. 327/94 |

OTHER PUBLICATIONS

Patent Abstracts of Japan, vol. 2000, No. 8, Oct. 6, 2000 and JP 2000 132989 A (Kobayashi Haruo; Sanyo Electric Co. Ltd.), May 12, 2000, abstract Figure 2.

* cited by examiner

Primary Examiner—My-Trang Nu Ton
(74) Attorney, Agent, or Firm—Wolf, Greenfield & Sacks P.C.

(57) ABSTRACT

The invention relates to electronic "sample and hold" circuits and, in particular, to such circuits which may implemented in integrated form. A method and circuit are provided for improving isolation during the hold mode of operation of a sampling circuit. An input differential signal is provided to parallel circuit paths (viz. a primary sampling path and an isolation path) which are identical (electronically equivalent) and, therefore, provide the same impedance leading to hold capacitor(s). The circuit paths are configured, relative to the differential inputs, so that any feed through (leakage) of the differential input signal is subtracted (cancelled) during the hold mode.

12 Claims, 2 Drawing Sheets

SIGNAL SAMPLING METHOD AND CIRCUIT FOR IMPROVED HOLD MODE ISOLATION

BACKGROUND TO THE INVENTION

1. Field of the Invention

The invention relates to electronic "sample and hold" circuits (alternately referred to as "track and hold", "sampler" circuits or "sub-sampling mixers") and, in particular to such circuits which may implemented in integrated form (i.e. integrated semiconductor circuits).

2. Description of the Related Prior Art

Sampling circuits, using sampling gates, are commonly used in a variety of circuit applications to sample and hold analog signals for further processing. For example, such circuits are used in analog-to-digital converters, switch capacitor filters and other sampled domain circuits. The use of analog-to-digital converters (ADC's) in mixed signal integrated circuit systems is common and the function and design of many ADC circuits is known to persons skilled in the art. Generally, they function to convert an analog signal into a digital representation and include sample-and-hold circuits (also referred to herein, more simply, as sampling circuits).

Typically, a sampling circuit at the front end of an ADC circuit samples the input analog signal using appropriately configured sampling gates. This analog signal sampling step is referred to as the "sampling" (or "tracking") mode of the operation of a sampling circuit. The sampling circuit operates on a cyclical basis at a predetermined sampling (clock) frequency.

Two main modes of operation are associated with sampling circuits, namely, the aforementioned sampling mode and the "hold" mode. In the sampling mode of operation the sampling circuit allows the input signal to propagate through the sampling gates to one or more capacitors, also referred to as "hold" capacitor(s), where it is stored (i.e. maintained) until the end of a predetermined sampling time period when another sampling operation takes place and a new sampled signal arrives at the capacitor and is stored. During the hold mode of operation the objective is to block the input signal from propagating through the sampling gates and isolate the signal stored by the hold capacitor(s) so that it remains essentially unchanged and unaffected by any change of the input signal during the governing hold mode time period.

Many specific sampling circuits are known in the art. Examples of these are described in the following patent references: U.S. Pat. No. 4,962,325 issued Oct. 9, 1990, U.S. Pat. No. 5,315,170 issued May 25, 1994, U.S. Pat. No. 5,389,929 issued Feb. 14, 1995, U.S. Pat. No. 6,028,459 issued Feb. 22, 2000, U.S. Pat. No. 6,262,277 issued Jul. 17, 2001, U.S. Pat. No. 6,275,076 issued Aug. 14, 2001 and U.S. Pat. No. 6,384,758 issued May 7, 2002.

However, the known sample and hold circuits have not been successful to efficiently and effectively establish isolation between the input signal and the hold capacitor(s) during the hold mode and the degree to which effective isolation can be achieved is often a limiting factor in the performance and usefulness of these circuits. This is due to the occurrence of signal leakage during the hold mode of operation permitted by parasitic components inherent to the sampling gates, whereby undesired parts of the input signal are able to pass through to the hold capacitor(s). These parasitic components represent a low impedance between the inputs and hold capacitor(s).

Radio frequency (RF) or intermediate frequency (IF) sampling circuits are sometimes referred to as sub-sampling mixers because the act of sampling a high frequency signal with a lower frequency sampling clock has the effect of both sampling the signal and mixing the frequency down, as understood by one skilled in the art. The parasitic components of the sampling circuit present a particularly difficult problem for sampling gates used for RF and IF sampling circuits in wireless receivers.

By reason of the foregoing limitations of known sampling circuits, there exists a need for new and effective means to improve the isolation level achievable by such circuits during the hold mode of their operation.

SUMMARY OF THE INVENTION

In order to overcome the deficiencies of the prior art, the present invention provides a new and effective means for achieving improved isolation in a sampling circuit during the hold mode of its operation. It has been discovered that that an effective isolation can been achieved during the hold mode of operation of a sampling circuit by providing parallel circuit paths, which are identical (electronically equivalent) and therefore provide the same impedance leading to the hold capacitor(s), and applying differential inputs in a configuration which cancels (subtracts) any feed through (leakage) input signal to the storage means during the hold mode of operation. This approach contrasts with the conventional approaches typically taken for the design of sampling circuits which focus on the parasitic characteristics or effects of the individual circuit elements.

In accordance with one aspect of the invention there is provided a sampling circuit configured for operating in a sampling mode and a hold mode on an alternating basis at a predetermined sampling frequency, the sampling circuit comprising: a primary sampling signal path comprising sampling means configured for sampling a differential input signal (Vin+, Vin−) and transmitting a sampled signal corresponding to the differential input signal for storage by storage means, during the sampling mode of operation of the sampling circuit, and for blocking the input signal from the storage means during a hold mode of operation of the circuit; and, an isolation signal path in parallel with the primary sampling signal path and comprising means for blocking the differential input signal from said storage means during the sampling and hold modes of operation of the sampling circuit, wherein the sampling and blocking means are configured to present substantially the same impedance to the differential input signal and to effectively cancel, during the hold mode of operation, any leakage of the differential input signal transmitted through the primary and isolation paths.

In accordance with a second aspect of the invention there is provided a method for sampling a signal comprising the steps: providing a differential signal (Vin+, Vin−); sampling the differential signal and transmitting a sampled signal corresponding to the differential signal through a primary sampling signal path for storage by storage means, during a sampling period, and blocking the differential signal from said storage means during a hold period, whereby the sampling and hold periods alternate at a predetermined sampling frequency; providing an isolation signal path in parallel with the primary sampling signal path and blocking the differential signal from the storage means during the sampling and hold periods, whereby the primary sampling signal and isolation signal paths present substantially the same impedance to the differential input signal; and configuring the differential signal relative to the primary sampling and isolation signal paths such that, during the hold period, any leakage of the differential signal transmitted through the primary sampling and isolation signal paths is cancelled.

Accordingly, the present invention advantageously provides an environment in which differing levels of leakage input signal components, to the storage means, can be tolerated and, in fact, used to cancel them out before they are "seen" by the storage means or produce any detrimental effect on the sampling functionality of the circuit.

BRIEF DESCRIPTION OF THE DRAWINGS

Exemplary preferred embodiments of the invention are described in detail below with reference to the following drawings in which like references refer to like elements throughout.

DETAILED DESCRIPTION OF THE PREFERRED EMBODIMENT

Figure 1A:
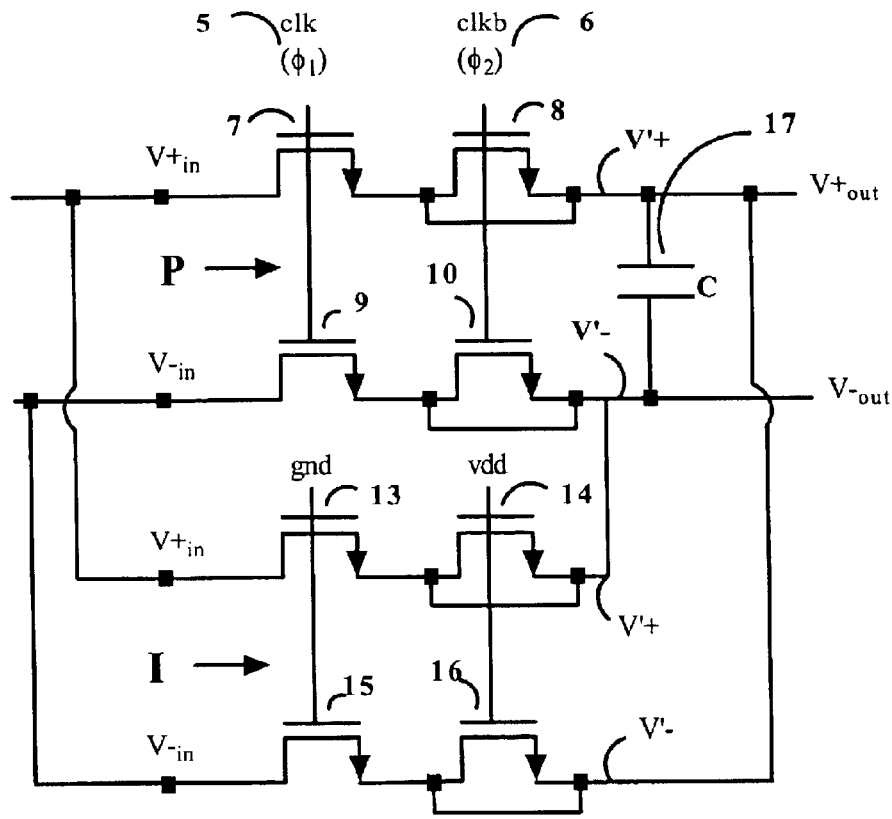
FIG. 1(a) illustrates a sampling circuit configured in accordance with the invention.
Figure 1B:
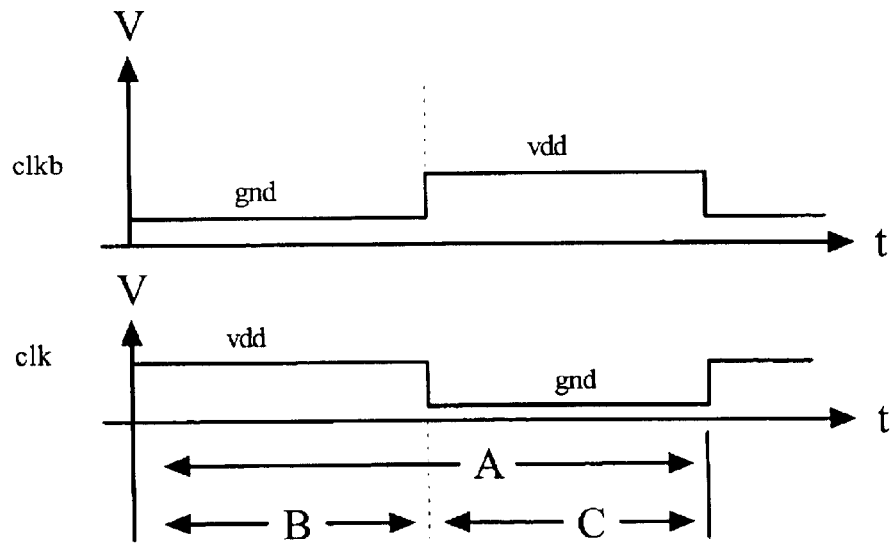
FIG. 1(b) illustrates the control signals operating in the sampling circuit of FIG. 1(a); and, FIG. 2 Illustrates an exemplary application of a sampling circuit configured in accordance with the invention (A) in which the sampled signal output by the sampling circuit is fed to hold capacitors ($C_1$), the outputs of which are amplified according to a conventional switched-capacitor gain circuit (B).

FIG. 1(a) of the drawings illustrates a basic sampling circuit in accordance with the invention. Advantageously, parallel circuit paths P and I are provided by sampling means comprising switch means 7,8,9,10, defining a primary sampling signal path P and blocking means comprising switch means 13,14,15,16, defining an isolation signal path I. The control of these switch means for each of the two circuit path differs, as shown by FIG. 1(b). Specifically, only the switch means of the primary sampling signal path P are activated (i.e. by sampling clock control signals clk and clkb) to open the switch means 7,8,9,10 at the start of each sampling cycle A, so as to pass the input signal Vin to storage means provided by a hold capacitor 17. At all times the switch means 13,14,15,16 of the isolation signal path I are closed so that this path is always in a hold mode of operation blocking any passage of Vin.

In operation, over one sampling cycle A, sampling gates 7 and 9 of the primary sampling signal path, being NMOS or PMOS transistors (gates) in the illustrated embodiment (but which could be any type of transistor or other switch means comprising a buffer or diode suitably configured to provide the switch means), are opened by a control signal clk 5 having phase $\phi_1$ for a predetermined sampling mode duration B, and then closed by control signal clk 5 for the remainder of the cycle consisting of the predetermined hold mode duration C. During the hold period C the signal on the hold capacitor 17 remains essentially unchanged from its value just prior to entering hold mode. Dummy transistors 8 and 10 are operated in opposition to the gates 7 and 9, by a control signal clkb 6 having phase $\phi_2$ which is the inverse of the phase $\phi_1$ of clk 5. Such use of dummy transistors controlled by non-overlapping clocks is known to, and used by persons skilled in the art to decrease the effect of clock feed through (charge injection) resulting from the switching of the sampling gates 7 and 9. Persons skilled in the art will be familiar with other means for reducing the effect of signal dependant charge injection and it is to be understood that another such suitable means could be used for a different embodiment instead of the dummy transistors used for this embodiment.

The transistors 7,8,9,10 match the transistors 13,14,15,16 and, therefore, the parallel circuit paths P and I consist of the same (electronically equivalent) elements. Consequently, each circuit path P and I presents substantially the same effective impedance to signals input thereto (i.e. Vin). Therefore, any feed through (leakage) of the input signal through to the hold capacitor 17 during the hold mode of operation will be equally split between the two circuit paths and the same leakage signal V' will result at the outputs of each path. In accordance with the present invention, a differential input signal Vin+ to Vin– is advantageously used so that, by switching the output lines for each path across the hold capacitor 17 as shown by FIG. 1(a), the output leakage signals across the output of each path, V'+ and V'–, are cancelled (subtracted). That is, the leakage output V'+ of the primary path and the leakage output V– of the isolation path are connected to one side of the hold capacitor 17 while the opposite leads of the outputs of the two paths are connected to the other side of the hold capacitor 17, whereby they subtract and cancel each other.

Figure 2:
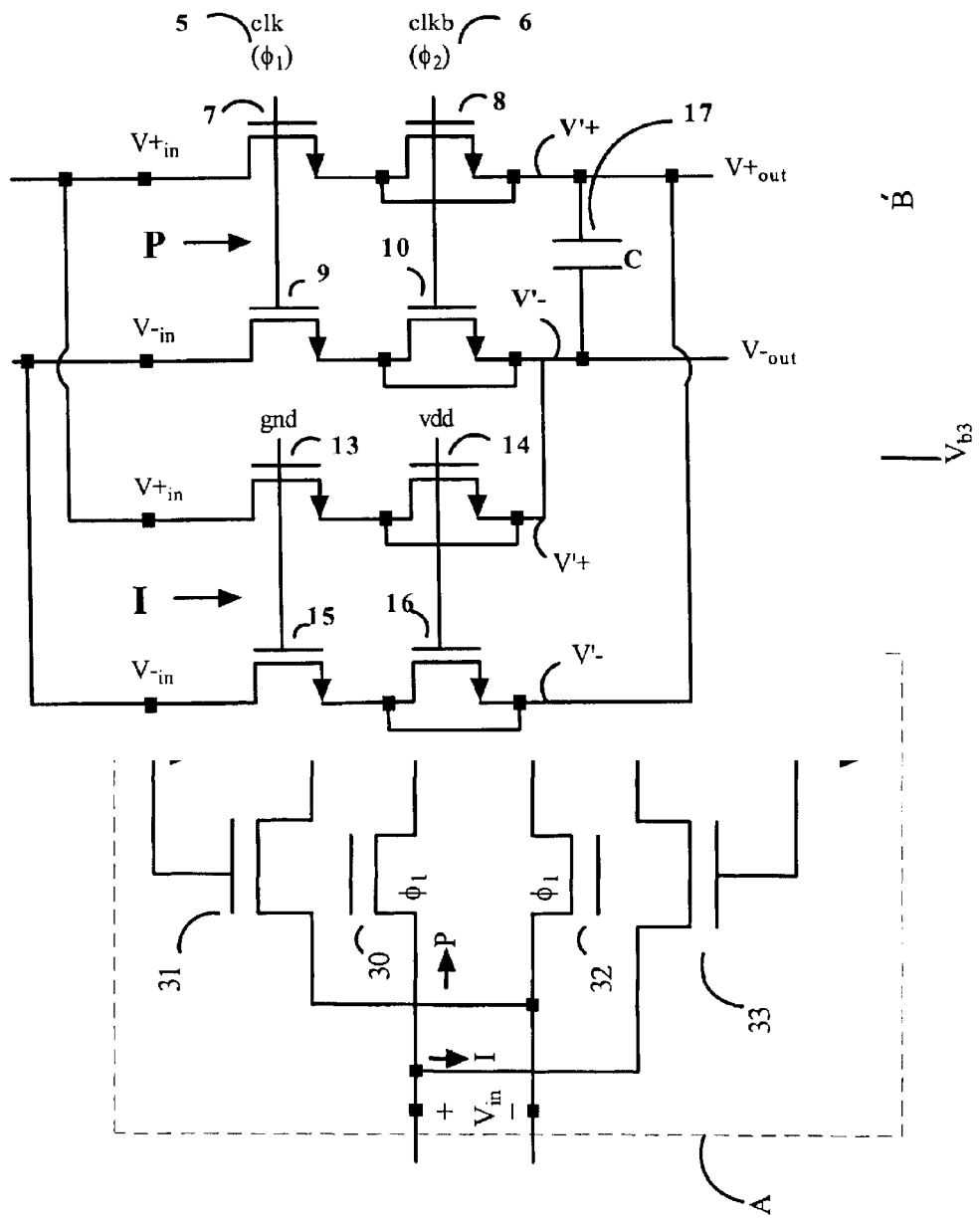

FIG. 2 illustrates an exemplary application of the sampling circuit of the present invention. In this illustrated application a sampling circuit configured in accordance with the invention is used to feed a conventional switched-capacitor gain circuit (B) with a sampled signal. As shown, the sampling circuit (A) outputs to hold capacitors $C_1$ a sampled signal $V_{OUT}$, corresponding to the input signal $V_{IN}$ during the sampling mode of operation (i.e. when a control signal having a phase $\phi_1$, opens switch means 30, 32). In accordance with the configuration of a conventional switched-capacitor gain circuit the output signal $V_{OUT}$ is amplified by operational amplifier 40 with feedback capacitors $C_2$ to produce an amplified output signal $V'_{OUT}$ having an inverted (i.e. negative) gain of $C_1/C_2$ (i.e. gain $=-C_1/C_2$). In this case, unlike the sampling circuit embodiment of FIG. 1, there is no need to include dummy transistors to handle charge injection since this is already handled by the transistors 34, 35 of the gain circuit B which are operated by control signals having phase $\phi_2$ which is non-overlapping with the phase $\phi_1$.

During the sample mode of operation of the sampling circuit (A), switch means, being transistor gates 30, 32 in this embodiment, are open and provide a primary sampling signal path P for the differential input signal Vin+ to Vin– to the hold capacitors 38, 39. During the hold mode of operation switch means 30, 32 are off and block the passage of the input signal Vin+ to Vin–. The hold capacitors 38, 39 remains essentially unchanged, during the hold mode, from their value just prior to entering hold mode. At all times switch means 31 and 33, which provide an isolation signal path I, are closed so that this path is always in a hold mode of operation blocking any passage of the input signal.

As described above with reference to the embodiment of FIG. 1, the switch means 30,32 and 31,33 are matched so that parallel circuit paths P and I consist of the same (electrically equivalent) elements. Because the differential inputs Vin+ to Vin– are interchanged at the input to each path P, I, as shown, any leakage signal passing through the two paths to the hold capacitors during the hold mode of operation will subtract and cancel each other at the output $V_{OUT}$.

By the foregoing examples the applicants have provided details of the invention claimed herein but it will be understood by persons skilled in the art that these are exemplary only and various other configurations and implementations may be devised to obtain the advantages provided by the invention without departing from the scope of the invention claimed herein.

The individual electronic elements and processing functions utilised in the foregoing described embodiment are, individually, well understood by those skilled in the art. It is to be understood by the reader that a variety of other implementations may be devised by skilled persons for substitution. Moreover, it will be readily understood by persons skilled in the art that various alternative configurations and types of sampling gates may be selected for use in place of those used for the described embodiments herein. The claimed invention herein is intended to encompass all such alternative implementations, substitutions and equivalents. Persons skilled in the field of electronic and communication design will be readily able to apply the present invention to an appropriate implementation for a given application.

Consequently, it is to be understood that the particular embodiments shown and described herein by way of illustration are not intended to limit the scope of the invention claimed by the inventors/assignee which is defined by the appended claims.

We claim:

1. A sampling circuit configured for operating in a sampling mode and a hold mode on an alternating basis at a predetermined sampling frequency, said sampling circuit comprising:
   (a) a primary sampling signal path comprising sampling means configured for sampling a differential input signal (Vin+, Vin−) and transmitting a sampled signal corresponding to said differential input signal for storage by storage means, during said sampling mode of operation of said sampling circuit, and for blocking said differential input signal from said storage means during a hold mode of operation of said sampling circuit; and,
   (b) an isolation signal path in parallel with said primary sampling signal path and comprising means for blocking said differential input signal from said storage means during said sampling and hold modes of operation of said sampling circuit,
wherein said sampling and blocking means are electrically equivalent to effectively cancel, during said hold mode of operation, any leakage of said differential input signal transmitted through said primary and isolation paths.

2. A sampling circuit according to claim 1 wherein said storage means comprises a capacitor.

3. A sampling circuit according to claim 2 wherein said primary sampling and isolation signal paths comprise identical circuits during said hold mode.

4. A sampling circuit according to claim 3 wherein said sampling means comprises a first switch means and said blocking means comprises a second switch means.

5. A sampling circuit according to claim 4 wherein said first switch means comprises at least one transistor and said second switch means comprises at least one transistor, and wherein said at least one transistor of said first switch means matches said at least one transistor of said second switch means.

6. A sampling circuit according to claim 5 wherein said at least one transistor associated with said first and second switch means respectively is taken from the group comprising NMOS transistors, PMOS transistors and diodes.

7. A sampling circuit according to claim 5 wherein said first and second switch means further comprise dummy transistors between said at least one transistor associated with said first and second switch means respectively, and said storage means.

8. A sampling circuit according to claim 7 further comprising first and second clocks for sending first and second control signals to said at least one transistor associated with said first and second switch means respectively, and said dummy transistors.

9. A method for sampling a signal comprising the steps:
   (a) providing a differential signal (Vin+, Vin−);
   (b) sampling said differential signal and transmitting a sampled signal corresponding to said differential signal through a primary sampling signal path for storage by storage means, during a sampling period, and blocking said differential signal from said storage means during a hold period, whereby said sampling and hold periods alternate at a predetermined sampling frequency;
   (c) providing an isolation signal path in parallel with said primary sampling signal path and blocking said differential signal from said storage means during said sampling and hold periods, wherein said primary sampling and isolation signal paths are electrically equivalent; and
   (d) configuring said differential signal relative to said primary sampling and isolation signal paths such that, during said hold periods, any leakage of said differential signal transmitted through said primary sampling and isolation signal paths is cancelled.

10. The method of claim 9 wherein said step of sampling comprises sending a first clock signal having phase $\phi_1$ to sampling gates associated with said primary sampling signal path.

11. The method of claim 10 wherein said step of blocking comprises sending a second clock signal having a phase $\phi_2$ to dummy transistors associated with said primary signal path, and wherein said first and second clock signals are non-overlapping.

12. The method of claim 9 further including the step of delivering said differential signal stored in said storage means to a switched capacitor gain circuit.

* * * * *